United States Patent
Lorusso et al.

(10) Patent No.: US 8,006,202 B2
(45) Date of Patent: Aug. 23, 2011

(54) SYSTEMS AND METHODS FOR UV LITHOGRAPHY

(75) Inventors: Gian Francesco Lorusso, Overijse (BE); In Sung Kim, Suwon-si (KR); Byeong Soo Kim, Hwasung-si (KR); Anne-Marie Goethals, Oud-Heverlee (BE); Rik Jonckheere, Muizen (BE); Jan Hermans, Lummen (BE)

(73) Assignees: IMEC, Leuven (BE); Samsung Electronics Co., Ltd., Suwon-Si, Gyenoggi-Do (KR)

( * ) Notice: Subject to any disclaimer, the term of this patent is extended or adjusted under 35 U.S.C. 154(b) by 652 days.

(21) Appl. No.: 12/035,343

(22) Filed: Feb. 21, 2008

(65) Prior Publication Data

US 2008/0229273 A1   Sep. 18, 2008

(30) Foreign Application Priority Data

Feb. 23, 2007  (EP) .................................. 07447013

(51) Int. Cl.
*G06F 17/50* (2006.01)
*G06F 19/00* (2011.01)
*G03F 1/00* (2006.01)
*G21K 5/00* (2006.01)

(52) U.S. Cl. ............ 716/53; 716/54; 700/120; 700/121; 430/5; 378/35

(58) Field of Classification Search ...................... 716/21; 700/120, 121; 430/5; 378/35
See application file for complete search history.

(56) References Cited

U.S. PATENT DOCUMENTS

| | | | | |
|---|---|---|---|---|
| 5,798,936 A | * | 8/1998 | Cheng | 716/13 |
| 6,370,673 B1 | * | 4/2002 | Hill | 716/2 |
| 7,197,734 B1 | * | 3/2007 | Singh et al. | 716/8 |
| 7,290,239 B1 | * | 10/2007 | Singh et al. | 716/18 |

(Continued)

FOREIGN PATENT DOCUMENTS

EP      1688794 A2     8/2006

OTHER PUBLICATIONS

Jonckheere, et al., Assessment of EUV reticle blank availability enabling the use of EUV tools today and in the future, $23^{rd}$ European Mask and Lithography Conference, Jan. 22, 2007 (& Proc. of SPIE, vol. 6533, May 2007).

(Continued)

*Primary Examiner* — Phallaka Kik
(74) *Attorney, Agent, or Firm* — Knobbe Martens Olson & Bear LLP

(57) ABSTRACT

A method of designing a lithographic mask for use in lithographic processing of a substrate is disclosed. The lithographic processing comprises irradiating mask features of a lithographic mask using a predetermined irradiation configuration. In one aspect, the method comprises obtaining an initial design for the lithographic mask comprising a plurality of initial design features having an initial position. The method further comprises applying at least one shift to at least one initial design feature and deriving there from an altered design so as to compensate for shadowing effects when irradiating the substrate using a lithographic mask corresponding to the altered design in the predetermined irradiation configuration. Also disclosed herein are a corresponding design, a method of setting up lithographic processing, a system for designing a lithographic mask, a lithographic mask, and a method of manufacturing it.

25 Claims, 14 Drawing Sheets

U.S. PATENT DOCUMENTS

| | | | |
|---|---|---|---|
| 7,574,685 B1 * | 8/2009 | Dong et al. | 716/11 |
| 7,669,160 B2 * | 2/2010 | Furnish et al. | 716/9 |
| 7,752,588 B2 * | 7/2010 | Bose | 716/10 |
| 2002/0192571 A1 | 12/2002 | Schwarzl | |
| 2003/0013216 A1 | 1/2003 | Rau | |
| 2004/0137677 A1 | 7/2004 | Lowisch et al. | |
| 2004/0157136 A1 | 8/2004 | Chandhok et al. | |
| 2007/0204252 A1 * | 8/2007 | Furnish et al. | 716/10 |
| 2008/0216025 A1 * | 9/2008 | Furnish et al. | 716/2 |
| 2008/0216039 A1 * | 9/2008 | Furnish et al. | 716/9 |
| 2008/0216040 A1 * | 9/2008 | Furnish et al. | 716/10 |
| 2009/0254874 A1 * | 10/2009 | Bose | 716/6 |

OTHER PUBLICATIONS

Sugawara, et al., Pattern printability for off-axis incident light in extreme ultraviolet lithography, Journal of Microlithography Microfabrication & Microsystems, SPIE-Int. Soc. Opt. Eng., vol. 2, No. 1, Jan. 2003, USA.

European Search Report dated Jul. 9, 2007 for EP Application No. 07447013.

* cited by examiner

SYSTEMS AND METHODS FOR UV LITHOGRAPHY

BACKGROUND OF THE INVENTION

1. Field of the Invention

The present invention relates to the field of ultraviolet (UV) lithography. More particularly, the present invention relates to methods and systems for performing and optimizing ultraviolet lithography, e.g. extreme ultraviolet lithography (EUVL).

2. Description of the Related Technology

In the production of today's integrated circuits, optical lithography is one of the key techniques. The ongoing miniaturization of integrated circuits or other devices has resulted in the use of new types of lithography, e.g. in lithography using electromagnetic radiation with short wavelength. A typical example thereof is extreme ultraviolet lithography.

The EUVL projection optics is composed by multiple mirrors, as shown in FIG. 1, illustrating a lithographic system 100 comprising an irradiation source 102, a mask 104 and a substrate 106. Whereas in conventional lithography techniques light typically is transmitted through the reticle, extreme ultraviolet lithography typically uses a reflective mask with a multi-layer coating. The illumination therefore typically is performed using illumination system that is non-telecentric with respect to the reticle side. In other words, illumination of the reticle typically is performed with a non-zero angle of incidence. In lithography application wherein the wavelength of the radiation used is substantially of the same order of magnitude or smaller than the thickness of the reticle features, the mask is to be approximated as a thick mask where radiation having a non-zero angle of incidence might be blocked by reticle features. In operation, EUV radiation thus illuminates the mask, causing an asymmetry of the diffracted waves because the oblique illumination (incident angle larger than zero) on a thick mask. The illumination beam is then shadowed by the edge of the absorber, and as a result, the printed patterns are shifted and/or biased. This effect is generally reported as shadowing. In addition, for large-field systems such as EUV scanners, the optics is off axis, which means that the illumination at the reticle is a curved slit.

A number of correction techniques are known for dealing with shadowing effects in extreme ultraviolet (EUV) lithography. Some solutions include the provision of a reflective layer at the top, whereby absorbing material is provided at in between the features or at the sides thereof. In US 2003/0013216 A1 a method for fabricating an EUV reflection mask is described wherein the EUV reflection mask is constructed by writing a pattern in a multiplayer on a mask. The latter results in a mask wherein no shadowing effect occurs at the light absorbing regions as their surface does not project from the surface of the multiplayer layer. In US 2002/0192571 A1, a method for fabricating a reflective lithographic mask is described wherein an absorber layer is applied on top of a substrate below a reflection layer or at the side areas of the reflection layer. In this way, shadowing effects are reduced as the absorber layer does not or less provide shadowing effects due to the configuration of the reflection layer. The methodology proposed to compensate shadowing in these cases involves heavy changes in mask topography. The latter often results in high manufacturing costs and technical complexity. Another methodology suggests to modify the aberrations in the system to compensate for shadowing, as e.g. described in US patent application 2004/0157136A1 and US2004/01376677A1, having a significant impact on the optical performance of the system.

SUMMARY OF CERTAIN INVENTIVE ASPECTS

One inventive aspect relates to a method for designing a lithographic mask for use in lithographic processing of a substrate, the lithographic processing comprising irradiating mask features of a lithographic mask using a predetermined irradiation configuration, the method for designing a lithographic mask comprising obtaining an initial design for the lithographic mask comprising a plurality of initial design features having an initial position, applying at least one shift to at least one initial design feature and deriving therefrom an altered design so as to compensate for shadowing effects when irradiating the substrate using a lithographic mask corresponding to the altered design in the predetermined irradiation configuration. The at least one shift of the at least one initial design feature may be independent of the orientation of the at least one initial design feature. It is an advantage of embodiments of the present invention that correction for the shadowing effect can be performed on the design level, thus allowing to use standard manufacturing methods for lithographic masks. The initial design for the lithographic mask may correspond with a predetermined pattern that is to be processed on the substrate. The at least one initial design feature may for example be a line or a contact hole. Alternatively the at least one initial design feature may also be part of a feature.

The at least one shift to at least one initial design feature may comprise applying at least a shading vector to at least one initial design feature and/or applying at least a shifting vector to at least one initial design feature. The shading vector may be a vector for compensating for a bias effect on the at least one initial design feature. The shifting vector may be a vector for compensating for an overlay effect on the at least one initial design feature.

Applying at least a shading vector to at least one initial design feature and deriving there from an altered design so as to compensate for shadowing effects may comprise deriving the altered design for compensating a bias effect on the initial design features. Applying at least a shifting vector to at least one initial design feature and deriving there from an altered design so as to compensate for shadowing effects may comprise deriving the altered design for compensating an overlay effect on the initial design features.

The at least one shift to at least one initial design feature may comprise a shift of at least two initial design features each shift being along a shifting axis, the shifting axes being intersecting. The intersection may be non-perpendicular. The shifting axes may be intersecting substantially on a design axis dividing the design in two parts of substantially equal size. The design axis may be a symmetry axis for the overall area of the design, whereby no symmetry needs to be present between particular features occurring at both sides of the symmetry axis. Independent from the orientation and shape of the features, the shift for symmetrically positioned features or parts thereof may be symmetric with respect to the design axis.

The direction of the shifting axis for design features positioned symmetrically with respect to the design axis may be mirrored with respect to the design axis.

The predetermined irradiation configuration may comprise a predetermined position between mask features and an irradiation source. The method may comprise obtaining a mapping (M) of the predetermined irradiation configuration based on a perpendicular projection (P) of the irradiation source on the plane determined by the mask features and a mapping of the projected irradiation source and the mask features to the initial design and determining directions of incidence of mapped irradiation on the initial design features, whereby applying at least one shift to at least one initial design feature comprises applying a shift of the at least one initial design feature along the directions of incidence of mapped irradiation on the initial design features. It is an advantage of embodiments of the present invention that an efficient method for adjusting the mask design can be obtained while still obtaining good correction for shadowing effects. It is an advantage of embodiments of the present invention that both overlay, i.e. position of different features with respect to each other and with respect to a predetermined pattern to be obtained, and/or bias, i.e. size of the different features, can be corrected.

The direction of incidence of mapped irradiation may be determined by the position of the mapped projected irradiation source and the position of the initial design feature. The direction of incidence of the mapped irradiation may be determined by a line between a central point of the mapped projected irradiation source and the position of the initial design feature, e.g. the centre of gravity of the initial design feature. The direction of incidence of mapped irradiation may make an angle M(θ) with respect to a symmetry axis of the mapped irradiation field of the mapped irradiation source. In the predetermined irradiation configuration the symmetry axis of the mapped irradiation field may be parallel with an edge of the mask.

The method for designing may take into account the height of the mask features used for the mask.

The lithographic mask may be a reflective lithographic mask. The predetermined irradiation configuration may comprise an off-axis irradiation source.

The lithographic processing may be deep ultra violet lithographic processing and/or extreme ultraviolet lithographic processing.

Mapping the projected irradiation source and the mask features to the initial design may comprise mapping the mask features to the initial design features and providing a mapped projected irradiation source having a relative position with respect to the initial design features substantially equal to the relative position of the projected irradiation source with respect to the mask features. It is an advantage of embodiments according to the present invention that for a given configuration of the irradiation source and the mask a fixed relation for mapping exists, resulting in a computational more efficient designing.

The predetermined irradiation configuration may comprise a ring-shaped irradiation source. It is an advantage of embodiments according to the present invention that the exact configuration of the lithographic setup can be taken into account.

The design may comprise a plurality of sections and initial design features positioned in the same section may be shifted in the same direction. The shift may be a shift with the same amplitude for features from the same section.

Two features positioned in sections positioned symmetric with respect to an axis of symmetry of the projected irradiation field of the irradiation source and/or with respect to a design axis dividing the design substantially in equal parts may be shifted in the same direction and with the same amplitude.

Deriving there from an altered design so as to compensate for shadowing effects may comprise deriving an altered design for compensating a bias effect on the initial design features.

Deriving an altered design may comprise providing at least one altered design feature in the altered design, the at least one altered design feature having a surface area covering at least the sum of the area covered by the surface area of the initial design feature positioned at least two different positions.

It is an advantage of embodiments according to the present invention that bias effects occurring due to shadowing can be taken into account.

The at least one altered design feature may have a surface area covering at least the area determined by a polygon determined by outer corners of the initial design feature positioned at least two different positions.

It is an advantage of embodiments according to the present invention that the obtained corrected design features have a polygonal structure. It is an advantage of embodiments according to the present invention that good correction for bias effects can be obtained while still obtaining an efficient design.

Applying at least one shift to at least one initial design feature may comprise applying a shift of the at least one initial design feature along the directions of incidence of mapped irradiation on a reference point of the initial design features. The reference point of the initial design features may be the centre of gravity of the initial design feature.

The amplitude of the at least one shift may depend on the position of the design feature in the design.

Deriving an altered design may comprise applying a local bias correction to a plurality of points along the perimeter of the feature.

Deriving an altered design may comprise applying a local overlay correction to a plurality of points along the perimeter of the feature.

The plurality of points may comprise one, some or all of the corner points of the feature. It is an advantage of embodiments according to the present invention that the obtained correction can be performed with a selectable degree of accuracy, resulting in the possibility to selectively select the degree of shadowing correction required for the features.

The amplitude of the at least one shift may be adapted as function of the direction of incidence of mapped irradiation on the initial design features.

It is an advantage of embodiments according to the present invention that the obtained correction takes into account differences in bias change depending on the irradiation angle of the irradiation beam used for irradiating the feature.

Deriving there from an altered design so as to compensate for shadowing effects may comprise deriving an altered design for compensating a shift of the initial design features.

It is an advantage of the present invention that correction can be obtained for overlay using an efficient correction method.

Compensation of a shift of the initial design features may comprise applying a shift having a fixed magnitude independent of the different orientations.

A correction of the size of the altered design features may furthermore be performed for adjusting the size of the altered design features to a target size for the imaged features.

Another inventive aspect relates to a lithographic mask for use in lithographic processing, the mask comprising mask features according to a predetermined design, the design obtained by a method for designing a lithographic mask as described above.

Another inventive aspect relates to a method for setting up a lithographic process, the lithographic process comprising irradiating mask features of a lithographic mask using a predetermined irradiation configuration, the method for setting up a lithographic process comprising selecting a lithographic mask, the lithographic mask having a design obtained using a method for designing as described above.

Another inventive aspect also relates to a method for lithographic processing a substrate, the method comprising irradiating mask features of a lithographic mask using a predetermined irradiation configuration, the lithographic mask having a design obtained using a method for designing as described above. One inventive aspect relates to a device made using such lithographic processing.

Another inventive aspect also relates to a design for a lithographic mask, the design comprising a plurality of design features, the design features determined by obtaining an initial design for the lithographic mask comprising a plurality of initial design features having an initial position, and applying at least one shift to at least one initial design feature and deriving there from an altered design so as to compensate for shadowing effects when irradiating the substrate using a lithographic mask corresponding to the altered design in the predetermined irradiation configuration.

Another inventive aspect furthermore relates to a system for designing a lithographic mask for use in lithographic processing of a substrate, the lithographic processing comprising irradiating mask features of a lithographic mask using a predetermined irradiation configuration, the system comprising an input means for obtaining an initial design for the lithographic mask comprising a plurality of initial design features having an initial position, a processing means for applying at least one shift to at least one initial design feature, and a calculating means for deriving there from an altered design so as to compensate for shadowing effects when irradiating the substrate using a lithographic mask corresponding to the altered design in the predetermined irradiation configuration.

Another inventive aspect also relates to a computer program product for executing a method for designing and/or setting up a lithographic process as described above. One inventive aspect relates to a machine readable data storage device storing the computer program product as described above and to transmission of such a computer program product over a local or wide area telecommunications network.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient and accurate lithographic processing methods and systems of this nature. The teachings of the present invention permit the design and manufacturing of improved devices, e.g. electronic devices such as for example semiconductor devices.

The above and other characteristics, features and advantages of certain inventive aspects will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
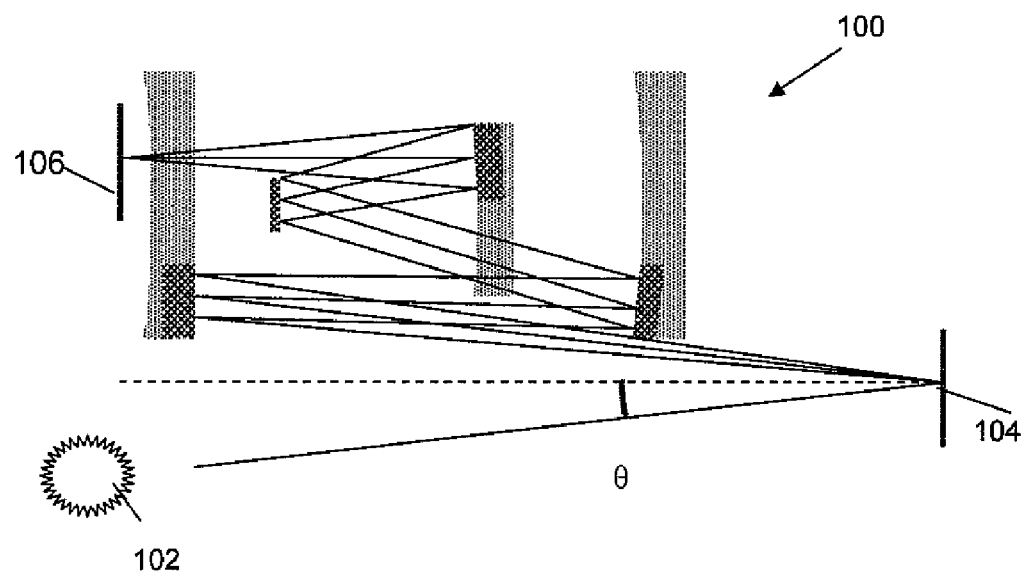
FIG. 1 shows a schematic of the projection optics in a EUVL system, as known from prior art.

In the different figures, the same reference signs refer to the same or analogous elements.

DETAILED DESCRIPTION OF CERTAIN INVENTIVE EMBODIMENTS

Certain embodiments relate to good apparatus or methods for setting up lithographic processing and/or to provide good methods and systems for designing masks for use in such lithographic processing, as well as to manufacture lithographic masks accordingly. It is an advantage of embodiments of the present invention that methods and systems are obtained that allow good compensation of shadowing occurring in lithographic processing, e.g. in deep ultraviolet lithographic processing and/or extreme ultraviolet lithographic processing. It is also an advantage of embodiments of the present invention that compensation of shadowing can be performed at the design level. It is furthermore an advantage of embodiments of the present invention that compensation of shadowing can be performed without the need to put additional burden on the technical complexity of the mask manufacturing process. It is also an advantage of embodiments of the present invention that compensation of shadowing can be performed without putting an additional burden on the imaging quality. It is an advantage of particular embodiments of the present invention that different shadowing behavior through slit can be taken into account.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The embodiments of the present invention are suitable for lithographic systems and methods using electromagnetic radiation with wavelengths having the same order of magnitude or being smaller than the reticle feature thickness. The latter typically includes extreme ultraviolet (EUV) radiation and X-ray radiation. For extreme ultraviolet radiation and X-ray radiation, a number of slightly different definitions are used in the field. Extreme ultraviolet radiation typically may include electromagnetic radiation in the wavelength range 31 nm to 1 nm and X-ray radiation typically may include electromagnetic radiation in the wavelength range of about 5 nm to 0.4 nm. It is to be noticed that the invention is not limited thereto and that slight variations in wavelength range may occur. Furthermore, for example lithography systems and methods using short wavelength radiation in the deep ultraviolet range, typically electromagnetic radiation in the wavelength range of about 250 nm to 7 nm, also may benefit from this embodiment.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first aspect, the present invention relates to a method for designing a lithographic mask for use in lithographic processing of a substrate and to designs for lithographic masks thus obtained. The lithographic processing thereby comprises irradiating mask features of a lithographic mask using a predetermined irradiation configuration, e.g. a given position of an irradiation source with respect to the mask and mask features, predetermined angles of incidence of the irradiation with respect to the mask features and a predetermined shape of the irradiation source. One of the lithographic processes envisaged is deep ultra violet lithographic processing and/or extreme ultraviolet lithographic processing. Shadowing effects in such lithographic processes typically are significant as the used irradiation wavelength is closer to the feature size of the mask features. The method therefore will be especially suitable for designing deep ultra violet lithographic masks and/or extreme ultraviolet lithographic masks, although the invention is not limited thereto. The mask may be made using conventional reflective mask techniques, for example but not limited to providing a reflective substrate and placing absorbing features thereon. The method for designing comprises obtaining an initial design for the lithographic mask to be made. The initial design preferably is based on a predetermined pattern to be processed in/on a substrate. The initial design comprises a plurality of initial design features. Such design features have their initial position in the design. The method furthermore comprises applying at least one shift to at least one of the initial design features. It furthermore comprises deriving, based on the shifted initial design features, an altered design so as to compensate for shadowing effects when irradiating the substrate using a lithographic mask corresponding to the altered design in the predetermined irradiation configuration. The method for designing may be adapted for providing a correction shift for different features of the design whereby the direction of shifts for these features is along intersecting axes. Such axes may be intersecting but not perpendicular. They may be non-parallel. The method for designing may comprise taking into account a height of the mask features that will be used. Such a parameter may be taken into account by using goniometric formulas, using models, using look up tables, etc.

The method for designing allows to overcome effects induced by shadowing effects occurring in the lithographic processing. Such shadowing effects may be an unwanted shift of the imaged features in the image with respect to their expected position based on the mask feature position in the mask. This effect often is referred to as overlay. It also may be an unwanted change in size of imaged features, with respect to the expected feature size based on the mask feature size. Such a change often is referred to as bias. Furthermore, as such changes may vary for different directions, different parts of the features are changed differently and a change in shape of the imaged feature may occur.

Figure 2:
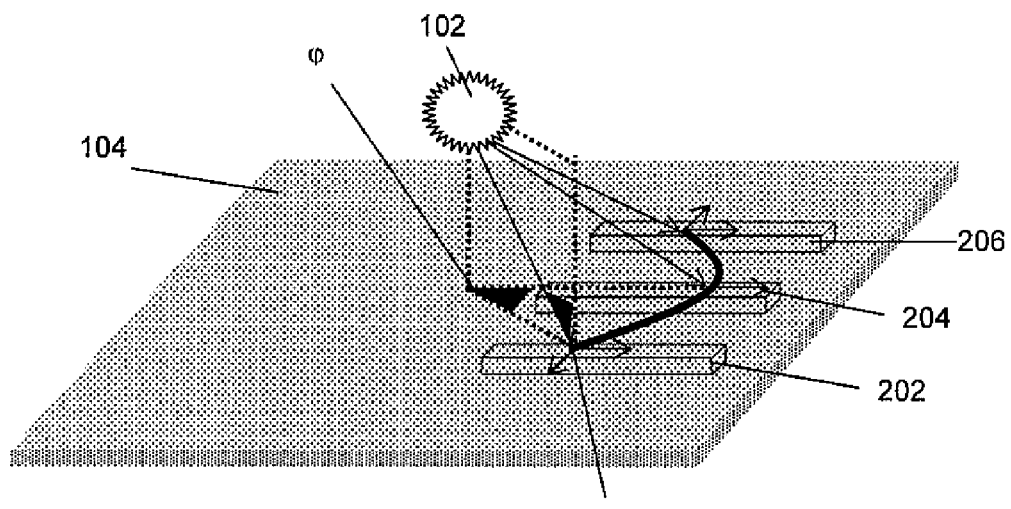
FIG. 2 illustrates different angles of incidence on mask features through slit, as can be compensated for by embodiments according to the present invention.

Different shadowing effects are illustrated by way of example in FIG. 2 to FIG. 5, the invention not being limited thereto. FIG. 2 illustrates a typical irradiation configuration for a lithographic process based on a reflective mask, i.e. whereby the irradiation is not incident in a perpendicular direction on the mask. In FIG. 2 the angle of incidence $\phi$ is shown with respect to a feature 202 for a given configuration of an irradiation source 102 and a mask. Other mask features 204, 206 also are indicated. When projected on the plane of the mask, i.e. the plane determined by the mask features, the angle of incidence for the irradiation with respect to the mask feature 202 corresponds with the azimuth angle $\phi$, as indicated in the drawing. FIG. 2 furthermore shows the different component for the projected irradiation incident on the mask features 202, 204, 206 whereby, depending on the position of the mask feature 202, 204, 206 with respect to the irradiation source 102 one or two components can be distinguished, the different components being indicated for the mask features using arrows. Preferably in lithographic processing illumination is performed off axis and the resulting irradiation on the mask is a curved slit. The azimuth angle $\phi$ varies through slit, as can be derived from FIG. 2.

Figure 3:
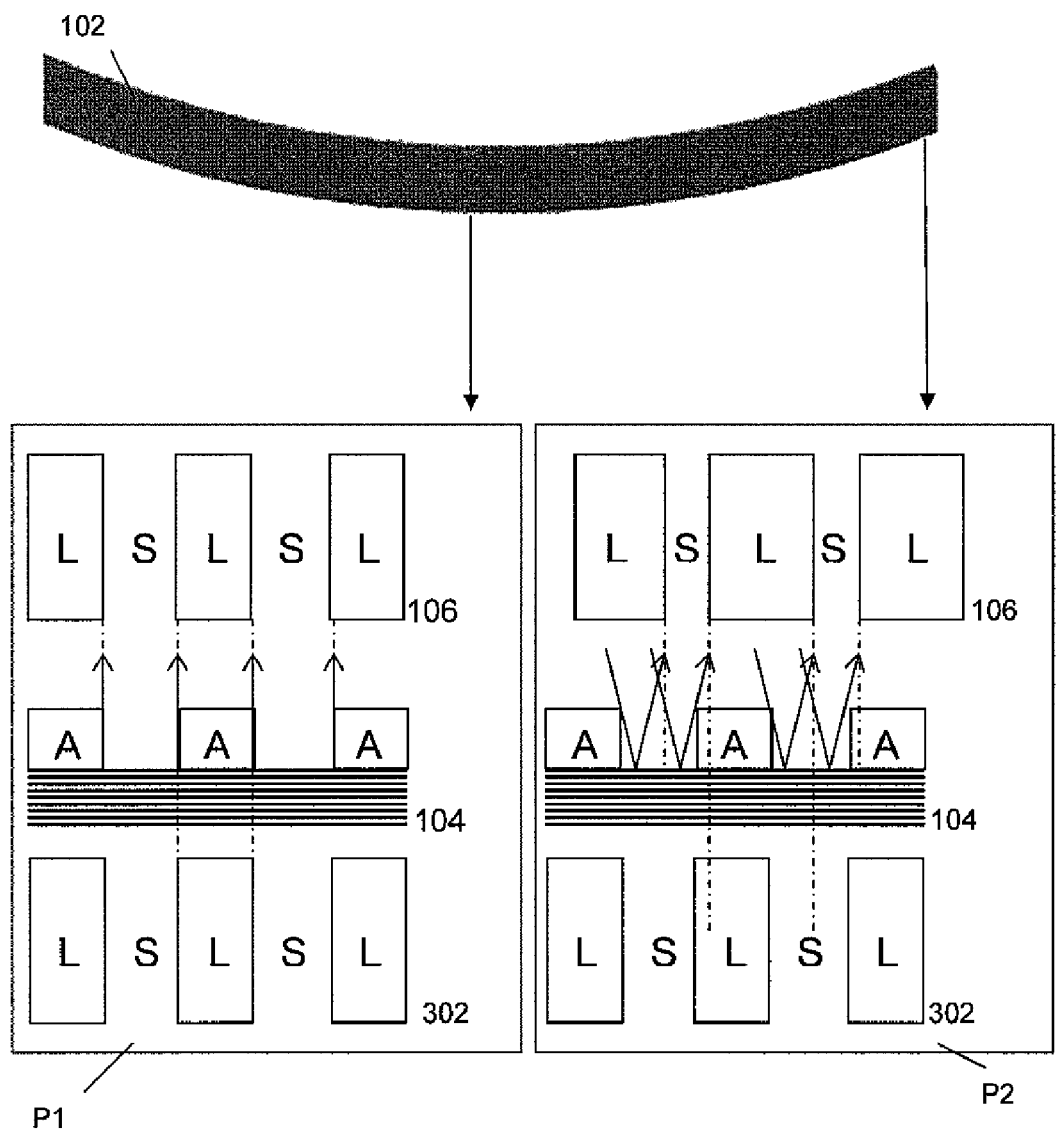
FIG. 3 shows the effect of slit position on bias and pattern shift of vertical lines, as can be compensated for by embodiments according to the present invention.

In FIG. 3, the effect of shadowing on mask features for two different positions P1 and P2, and thus a different azimuth angle of incidence with respect to a curved slit are illustrated. The first position P1 illustrates the absence of shadowing for three line features positioned such that the azimuth angle of the projected irradiation is 0°, i.e. the projected angle of incidence on the mask is in line with the mask features. It can be seen that no shadowing occurs. Different levels are illustrated, i.e. the design level 302 illustrating a design for lines L and spacings S to be patterned, the mask level 104 illustrating the corresponding mask features having absorbing parts A on a reflective multiplayer and the substrate 106 indicating the imaged lines L and imaged spacings S. The second position P2 illustrates the presence of shadowing effects for three line features positioned at the edge of the design, irradiated from a side of the curved slit irradiation. The same levels are illustrated. It can be seen that due to the presence of an azimuth angle of the irradiation, shadowing effects occur, resulting in altered size of the imaged features with respect to the mask features or corresponding design features.

Figure 4:
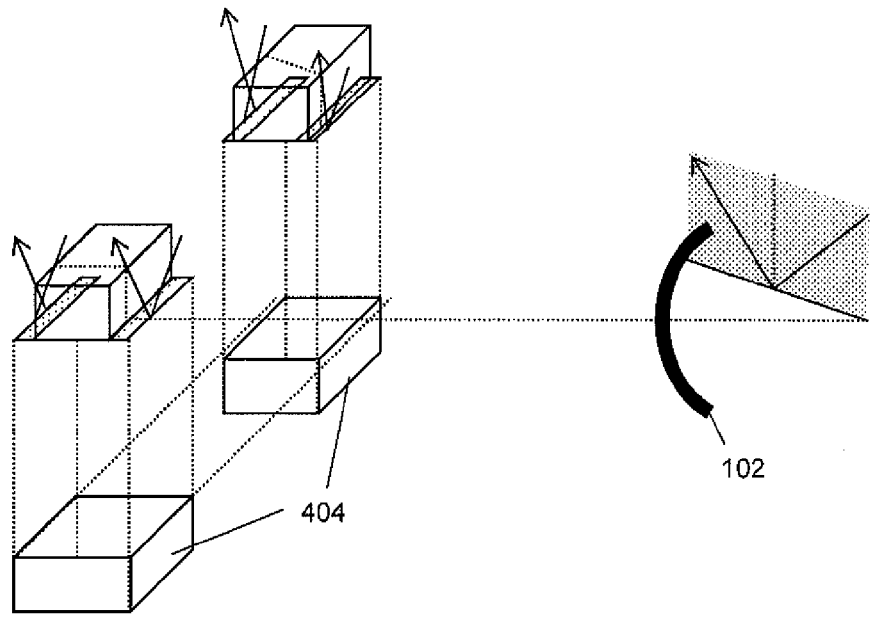
FIG. 4 shows effects of slit position on bias of horizontal lines, as can be compensated for by embodiments according to the present invention.

In FIG. 4 it is illustrated that the shadowing is dependent on the orientation of the feature. As an example it is shown that horizontal lines will print larger in the centre of the slit, while vertical feature will print correctly. The effect of shadowing on horizontal feature through slit is shown in FIG. 4. FIG. 4 indicates the irradiation source 102, in the present example being a curved slit shaped irradiation source, the design features 402 as on the mask and their resulting imaged features 404 without correction. It can be seen that thickness seen by the irradiation beam depends on the azimuth angle, resulting in different imaging on the substrate. By comparing FIGS. 3 and 4, we can see that the impact of shadowing is opposite for horizontal and vertical feature. The impact of shadowing is maximum in the centre slit for horizontal features and minimal for vertical features.

Figure 5:
FIG. 5 shows the effect of shadowing on contact holes in different position through slit, resulting in ellipticity and displacement of the feature centre, as can be compensated for using methods and systems according to particular embodiments of the present invention.
Figure 5:
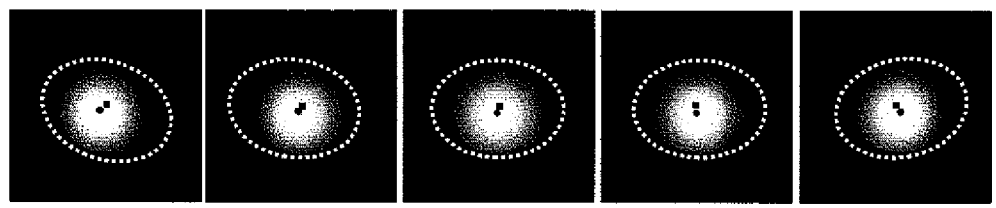

In FIG. 5 the shadowing effects are illustrated for the case of 2D features such as contact holes, the different bias between horizontal and vertical direction resulting in ellipticity. In addition, the shadowing effects will cause the displacement of the centre of the contact hole, as shown in FIG. 5. It is an advantage of embodiments of the present invention that corrections may be provided to overcome these shadowing effects, thus allowing to obtain improved lithographic processing and thus more accurate and reliable devices thus made.

The shifts to be applied, for correction of bias and/or for correction of overlay, also represented by shading vector and shifting vector, may be independent shifts. The amplitude may be slit dependent and the orientation may be a predetermined function of the angle of incidence of the mapped irradiation on the design feature at the design level.

It is an advantage of embodiments according to the present invention that calculations or determinations of the shift(s) to be applied for correction of bias and/or overlay can be restricted to one of symmetric parts in the irradiation field generated on the mask by the irradiation source. For example, the same shifts may be provided for features at symmetric positions with respect to a symmetry axis for the irradiation field generated. Furthermore, as will be illustrated further, the design may be divided in sections and the same correction shift may be applied to features present in the same section. The size of the sections may be selected in any suitable way.

It may depend on a predetermined correction accuracy for bias and/or overlay effects due to shadowing.

The method for design according to the present invention will now be described in more detail with respect to a plurality of embodiments, introduced by way of illustration, the invention not limited thereto.

Figure 14:
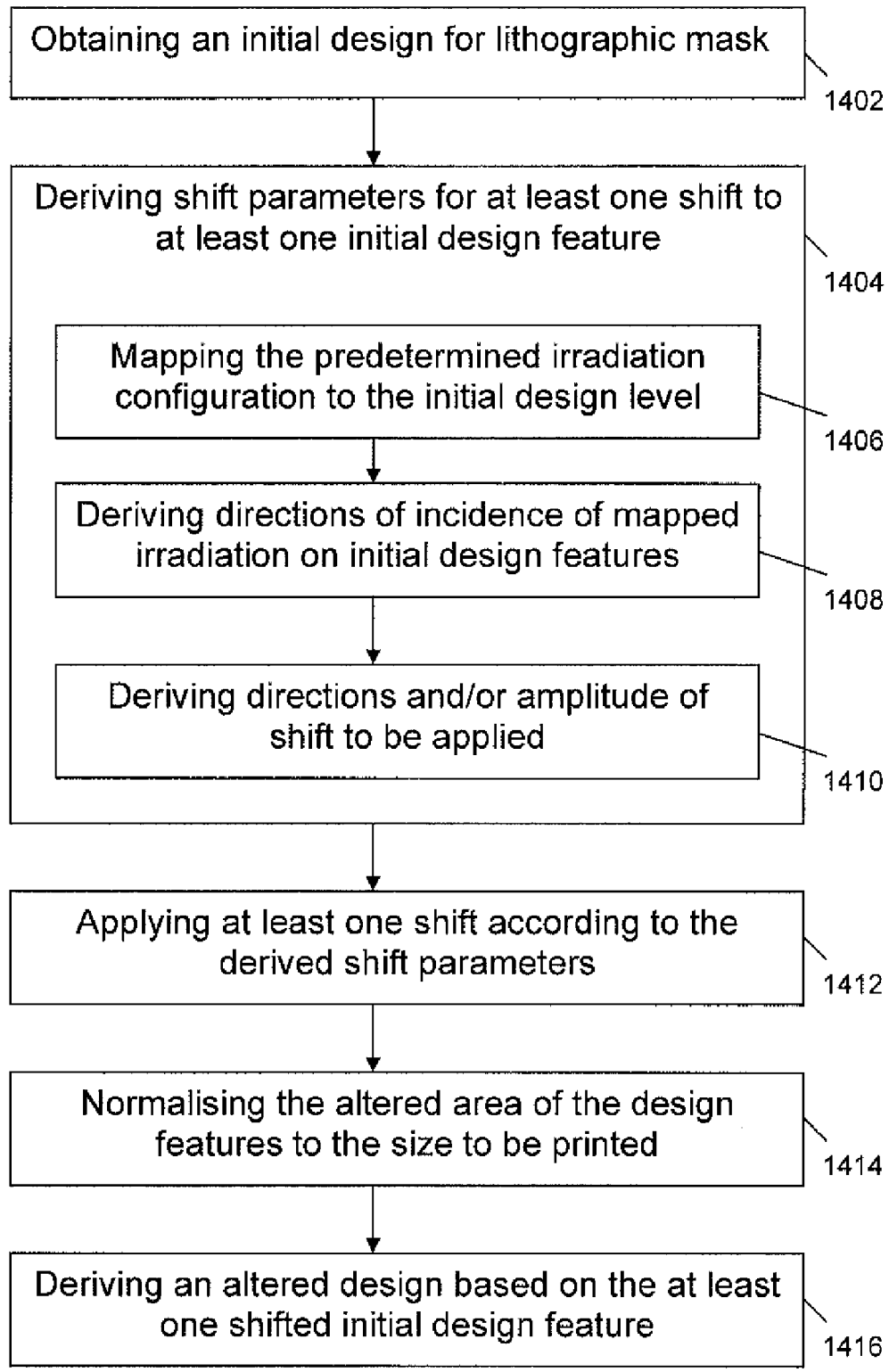
FIG. 14 illustrates a flow diagram of a method for designing according to embodiments of the first aspect of the present invention.

In a first embodiment according to the first aspect, the present invention relates to a method for design as set out above. The embodiment is described by way of illustration using the exemplary method 1400 shown in FIG. 14, indicating standard and optional process.

In a first process 1402, the method 1400 comprises obtaining an initial design for the lithographic mask comprising a plurality of initial design features having an initial position. Such an initial design preferably is based on the pattern to be processed on the substrate. Such an initial design may be set up using conventional software tools. Obtaining an initial design may comprise determining an initial design or obtaining it in a pre-made form. Such an initial design may e.g. comprise additional features such as e.g. OPC features, the invention not being limited thereto.

The designing method 1400 also comprises applying 1410 at least one shift to at least one initial design feature. The method therefore may comprise deriving 1404 shift parameters for at least one shift to at least one initial design feature. Deriving thereby may comprise a process of mapping 1406 of the predetermined irradiation configuration based on a projection of the irradiation source on the plane determined by the mask features and a mapping of the projected irradiation source and the mask features to the initial design. The projection may be a perpendicular projection on the mask level, although the invention is not limited thereto. In other words, the direction of incidence of the irradiation on the mask features is taking into account at the design level by projecting the irradiation source to the plane of the mask level and by mapping the position of the mask features to the design features and mapping the position of the projected irradiation source having a relative position with respect to the mask features, to the corresponding relative position with respect to the mapped mask features, i.e. the design features. From the obtained mapped irradiation configuration to the design level, the directions of incidence of mapped irradiation on the initial design features can be derived 1408. The directions of incidence of mapped irradiation may be determined by the position of the mapped projected irradiation source and the design feature considered. It may make an angle of incidence with a symmetry axis of a mapped projected irradiation field of the irradiation source, mapped to the design level. Based on the mapped irradiation on the design level, the direction and/or amplitude for the at least one shift to be applied can be derived 1410. Such derivation may be based on previously made reference measurements, based on look-up tables, based on test measurements or calculated using a mathematical algorithm, e.g. based on a mathematical model, based on projections and/or based on goniometric considerations. It is an advantage of one embodiment that the shift direction and/or the shift size will take into account the irradiation configuration for the lithographic system, i.e. it will depend on the relative position between the source and the parts of the mask being irradiated. The latter implies that at least part of the mapping parameters used for mapping the irradiation to the design level can be determined once for a given irradiation configuration and be used repeatedly for different designs.

In a following process, the method comprises applying 1412 a shift to at least one initial design feature along the directions of incidence of mapped irradiation on the initial design features. The method preferably thereby takes into account the determined amplitude for the shift. Following considerations and actions also may be covered by the derivation process 1410. The number of features for which a shift is applied depends on the orientation of the features and/or their position on the design. Whether or not features require a shift may be determined according to predetermined criteria, e.g. as function of values of the mapping parameters for the irradiation, e.g. as function of the angle between the feature and the angle of incidence of irradiation. Also parts of design features may be shifted separately. One technique may be to split features as function of their orientation according to a first or second direction, e.g. substantially horizontal and substantially vertical oriented features, and applying a shift or correction depending on the orientation of the features and the position in the design, with respect to the mapped irradiation. As illustrated in FIG. 3 and FIG. 4 there is a correlation between the orientation of the features, their position in the design with respect to the mapped irradiation and the impact of the shadowing. Such correlation may be taken into account for deciding the need for shift. The amount of shift also may be determined only for sectors of the design, i.e. all features being present in one sector may be subjected to a first shift, whereas all features being present in a second sector may be subjected to a second shift.

The method further may comprise a process of normalizing 1414 the biased area to the design value, in order to obtain the appropriate feature sizes to be imaged. Such normalization allows printing the features in target, as through the biasing and/or shifts the size of the features to be imaged may have changed. By normalizing, such a change is corrected, resulting in an appropriate feature size being imaged.

The method is further followed by deriving 1416 an altered design, based on the shifted initial design features so as to compensate for shadowing effects when irradiating the substrate using a lithographic mask corresponding to the altered design and for the predetermined irradiation configuration. The latter may comprise, although not limited thereto, using the shifted position of the initial design features, using a number of shifted position of the initial design features and deriving there from an altered design feature, etc. The latter may be performed in an automatic and/or automated way, using predetermined algorithms, neural networks or according to predetermined models. The process of normalizing 1414 may be incorporated in the process of deriving an altered design 1416, as deriving an altered design may influence the size of the design features that will be imaged.

Figure 16:
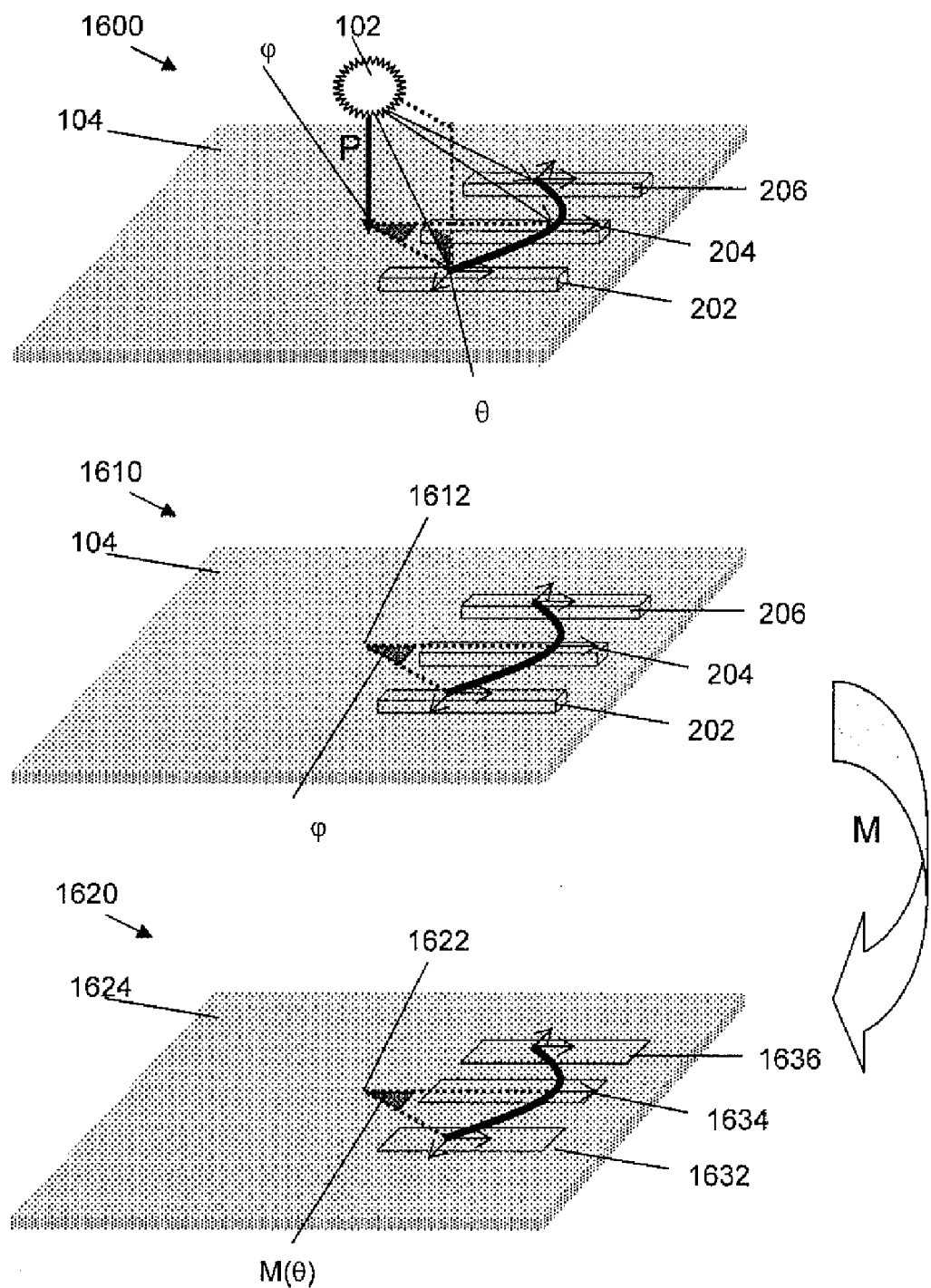
FIG. 16 illustrates the mapping of the predetermined irradiation configuration from the lithographic processing system to the design level, as can be used according to embodiments of an aspect of the present invention.

By way of example, FIG. 16 illustrates the mapping of the irradiation configuration 1600 to the design level 1620. In a first process a projection of the irradiation source 102 is performed to a projected irradiation source 1612 in the intermediate level 1610. This intermediate level then is mapped to the design level 1620 using a mapping function M mapping the mask features 202, 204, 206 to the design features 1632, 1634 and 1636 and mapping the projected irradiation source 1612 to a mapped projected irradiation source 1622. This mapping is performed to the design plane 1624. The angle of incidence of the mapped irradiation M(θ) corresponds with the azimuth angle φ in the predetermined irradiation configuration.

The method for designing may comprise taking into account a height of the mask features that will be used. Such a parameter may be taken into account by using goniometric formulas, using models, using look up tables, etc.

Figure 6:
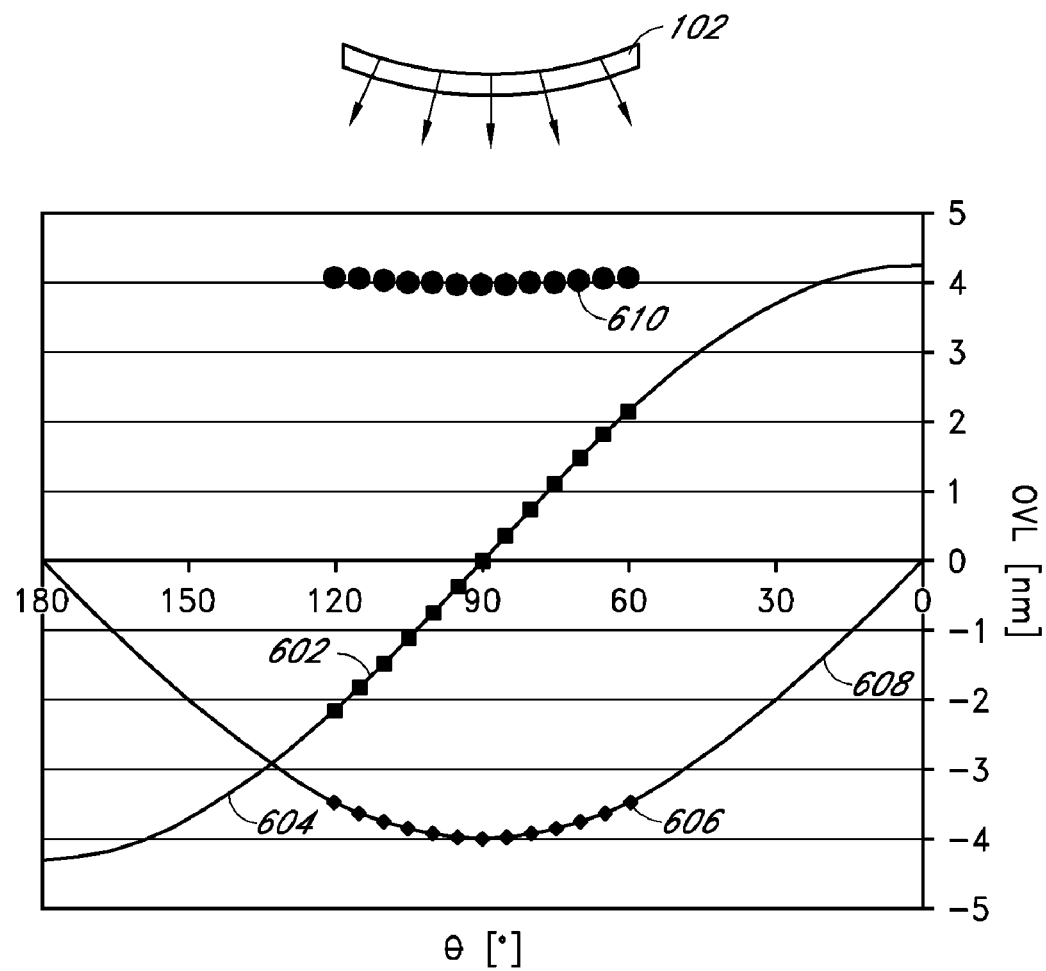
FIG. 6 shows the pattern displacement in X and Y, as well as absolute modulus of the displacement, as used in methods and systems according to particular embodiments of the present invention.

In a second embodiment according to the first aspect, the invention relates to a method for designing according to the methods as described above, e.g. but not limited to the method of the first embodiment, whereby deriving an altered design is adapted so as to compensate for a shift in position of the initial design features. In the present embodiment, correction therefore is applied for overlay. Such a displacement is indicated for contact holes in FIG. 5. By way of example, in terms of pattern placement error of contact holes, the shift in X and Y follow simple sinusoidal laws through slit, as shown in FIG. 6. The almost linear behavior in X along slit implies the possibility of a simple compensation strategy. The small deviation in Y along slit implies the possibility of compensating this component by shifting all features in Y, but this will not fully correct for the bow through slit. Alternatively, correction could be performed by shifting the features in the design in the direction opposite to the predicted or measured pattern feature displacement. More generally it is possible to demonstrate that the magnitude of the displacement is constant through slit, i.e. for different positions in the design, e.g. corresponding with different azimuth angles of the irradiation. The latter is also indicated FIG. 6. FIG. 6 shows the overlay occurring in the x-direction, indicated with squares 602 and approximated by a function 604 expressed as goniometric function $b.\cos(\theta)$, and in the y-direction, indicated with diamonds 606 and approximated by function 608 expressed as goniometric function $a.\sin(\theta)$. The square root of the sum of the power of two of the overlay in x-direction and overlay in y-direction also is indicated, referred to by discs 610 and given by $\sqrt{(OVL(X))^2+(OVL(Y))^2}$. It can be seen that this function is substantially constant.

Figure 7:
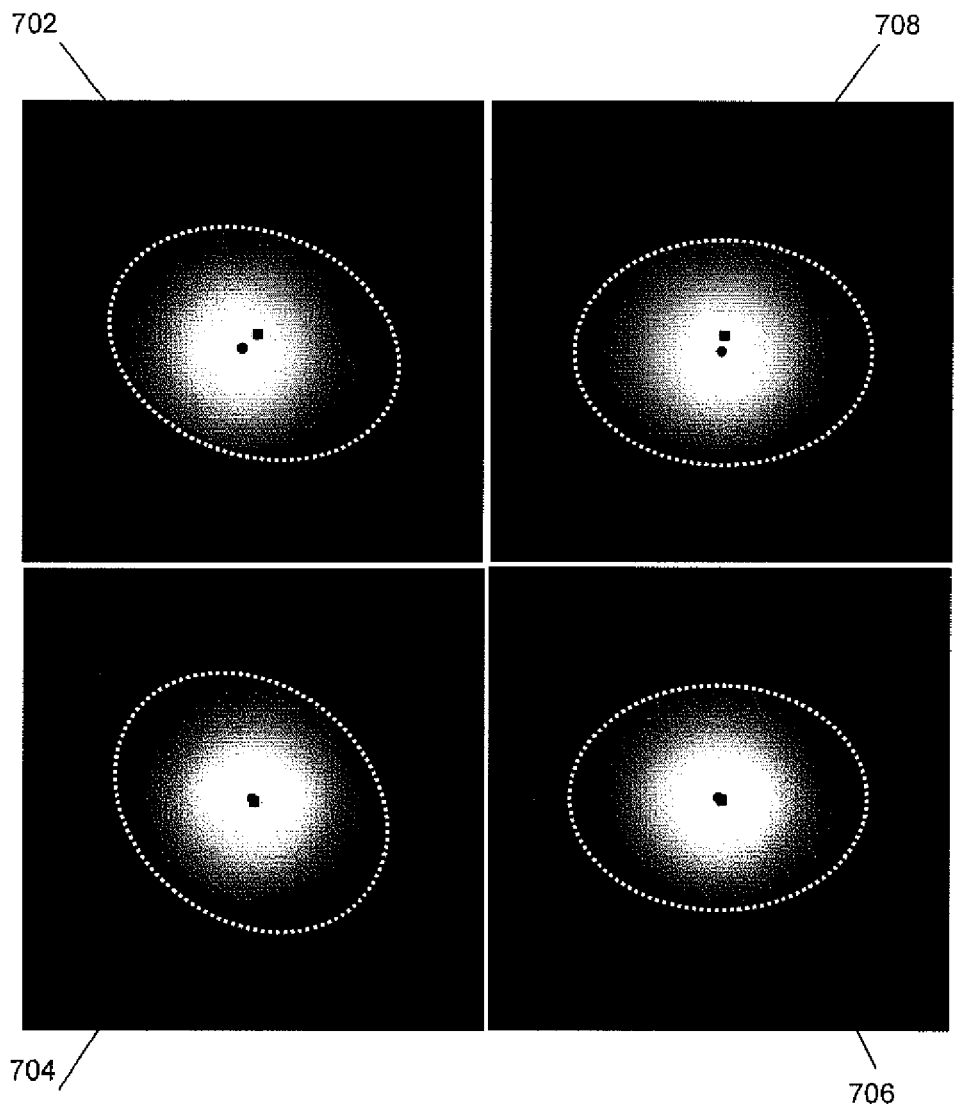
FIG. 7 shows the pattern displacement correction using shifting vector compensation according to a method for compensating shadowing effects according to particular embodiments of the present invention.
Figure 7:
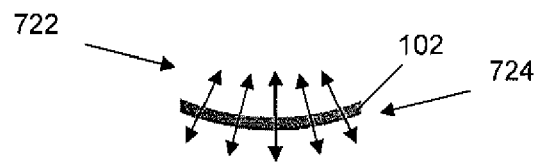

This indicates that only the direction of the displacement is changing through slit. Furthermore, the direction of the displacement through the slit, or in other words for different positions at the design level corresponds with the azimuth angle of the irradiation with respect to the feature, or still in other words with the direction of incidence of the mapped irradiation on the design level. Correction for overlay may be performed by performing a shift that has a fixed magnitude, i.e. independent of the different orientation of the mapped irradiation. If the required shift is described using a displacement vector, which is only one of possible mathematical expressions for indicating the shift, the amplitude of the displacement vector thus is constant. The amplitude of the shift applied for correcting the displacement due to the shadowing therefore can be the same. Furthermore the orientation of the shift to be applied also may be the same. Therefore, according to the present embodiment, the shift to be applied to the features in order to obtain an altered design for correcting for overlay may be a shift according to a vector having the same amplitude and opposite direction as the displacement vector for the features. In other words the correction shift may be according to a vector having a fixed amplitude and a direction corresponding with the direction of the incidence of the mapped radiation. The latter is illustrated for contact holes in FIG. 7. FIG. 7 indicates the obtained images for a contact hole at the edge of the slit, i.e. where the angle of incidence on the design features for the mapped irradiation is substantially different from zero, for a non-shift corrected image 702 of the contact hole and for a shift corrected image 704 of the contact hole. It also shows the obtained images for a contact hole in the centre of the slit, i.e. where the angle of incidence on the design features for the mapped irradiation is substantially zero, for a non-shift corrected image 706 and for a shift corrected image 708. The centers of the contact holes as designed are indicated by squares and the imaged centers are indicated by circles. It can be seen that for the corrected images the designed centers and the image centers are substantially closer to each other. FIG. 7 also indicates the displacement of the pattern due to shadowing effects through the slit, i.e. for different positions on the design or for different angles of incidence of the mapped irradiation on the design features by arrows 722 and the correction shift to be applied by arrows 724. To compensate pattern placement error caused by shadowing, the pattern placement error is neutralized by compensating the displacement vector with a vector having the same amplitude and opposite direction. As described above, the direction and amplitude may be determined based on the mapped irradiation on the design level, using the same methods and/or taking into account mapping parameters as described in the first embodiment.

In a third embodiment according to the first aspect, the invention relates to a method for design according to the methods as described above, e.g. but not limited to the method of the first embodiment and/or the method of the second embodiment, whereby deriving an altered design so as to compensate for shadowing effects comprises deriving an altered design for compensating a bias effect on the initial design features. The correction may be performed in combination with, before or after performing the displacement correction as described in the second embodiment. A number of different particular algorithms can be used for deriving such an altered design. The correction for bias may be based on using shifts of design features, whereby the shifts may have a different amplitude depending on the position of the design feature in the design. The amplitude may be larger for features positioned further away from a symmetry axis of the irradiation field projected, e.g. perpendicular, and mapped to the design plane.

Figure 8:
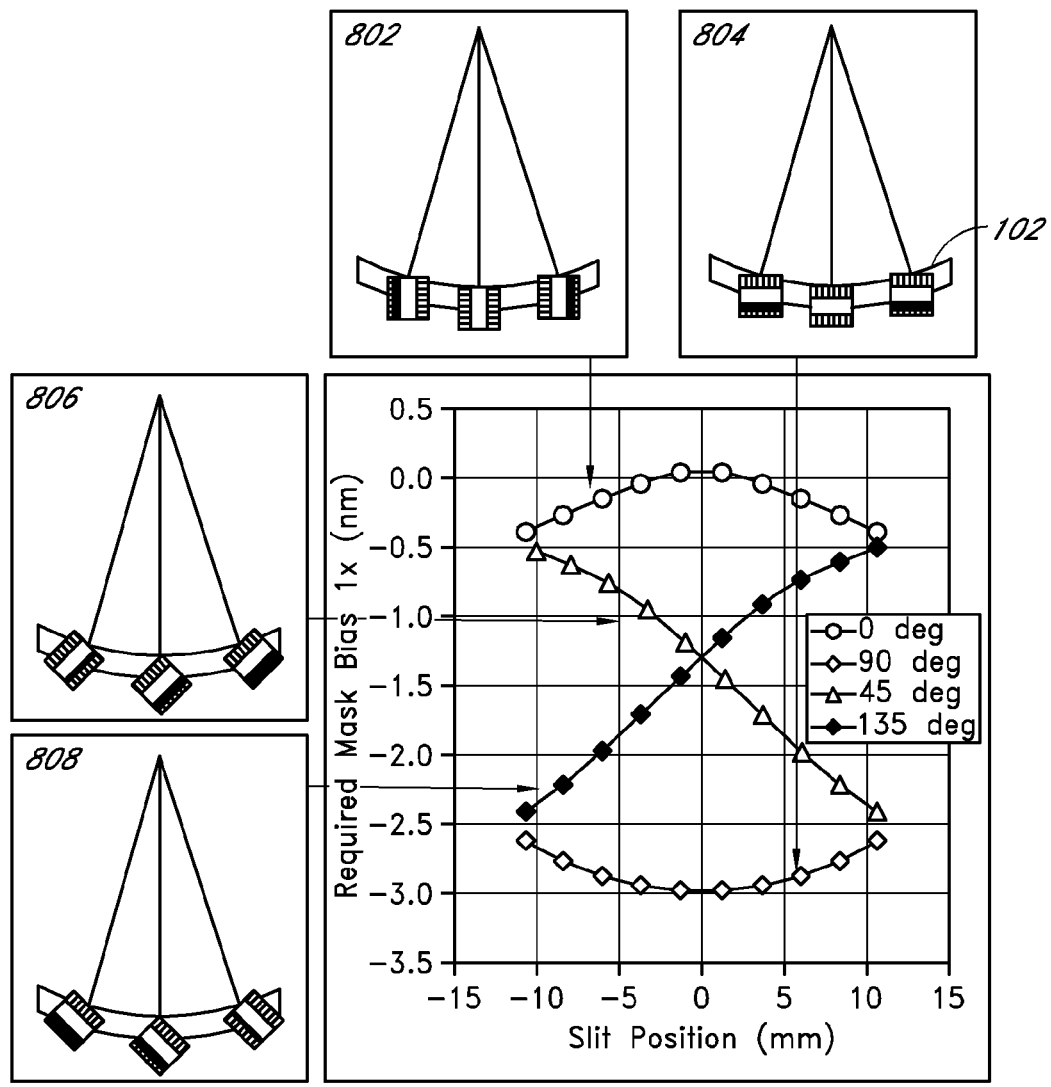
FIG. 8 shows an overview of the bias required for different feature orientation through slit as used in methods and systems according to particular embodiments of the present invention.

One possible algorithm is to apply bias and/or correct for pattern shift depending on the orientation of the pattern and the position of the feature in the design level, in other words depending on the direction of incidence of mapped irradiation. Different bias effects based on shadowing effects is illustrated in FIG. 8. FIG. 8 indicates the effect of the position of the design features with respect to the irradiation slit, i.e. the position of the design features in the design or in other words the angle of incidence on the design features for the mapped irradiation, on the required bias for different orientations of the design features. Results are shown for features oriented at 0° indicated by 802, at 90° indicated by 804, at 45° indicated by 806 and at 135° indicated by 808. Nevertheless, this is a complex and lengthy task even for simple lines. Furthermore, for real 2D features this algorithm is more difficult to apply as substantially more than one orientation is present for such features.

In a first algorithm, correction is applied by using at least one shifted initial design feature for determining the shape of the altered design feature. In one embodiment, deriving the altered design may be based on at least one shifted initial design feature. The latter may be performed as follows. The shape of the altered design feature may be determined based on the initial design feature positioned at a first position and the initial design feature positioned at a second position. At least one of these positions thereby is a shifted position with respect to the initial position of the initial design feature. The second position may be the initial position or a second shifted position. The required shift or shifts according to the present embodiment may be a shift or shifts having a direction related to the direction of incidence of mapped irradiation on the design feature, i.e. related to the azimuth angle for incidence of the irradiation on the corresponding mask feature. In other words, the direction of the shift is determined by the position of the feature in the design with respect to the predetermined irradiation configuration. The amplitude of the shading vector may depend on the position in the design, e.g. the lateral position in the design. It may be derived from the mapped irradiation on the design level. It may depend on mapping parameters and it may be configuration specific. The required shift may be described using the concept of a shading vector, which is only one of the different mathematical ways that can be used for expressing the shifts used in this correction. In a further preferred embodiment, the at least two positions may be obtained by shifting the initial design feature partly, e.g. half, in one sense along the direction of shift for the initial design feature and partly in the other sense along the direction of shift for the initial design feature with respect to the initial position. The shape of the design feature may be determined by selecting an altered design feature having a surface area covering at least the area covered by the surface area of the initial design feature positioned at at least two different positions. In a further preferred embodiment the surface area of the altered design feature may be determined by a polygon determined by the outer corners or vertexes of the initial design feature positioned at the at least two different positions. By using such altered design features in the predetermined irradiation configuration, the imaged features will be corrected for shadowing effects induced in the lithographic process and therefore result in a better target image, i.e. the imaged features being closer to the pattern to be printed on the substrate.

Figure 9:
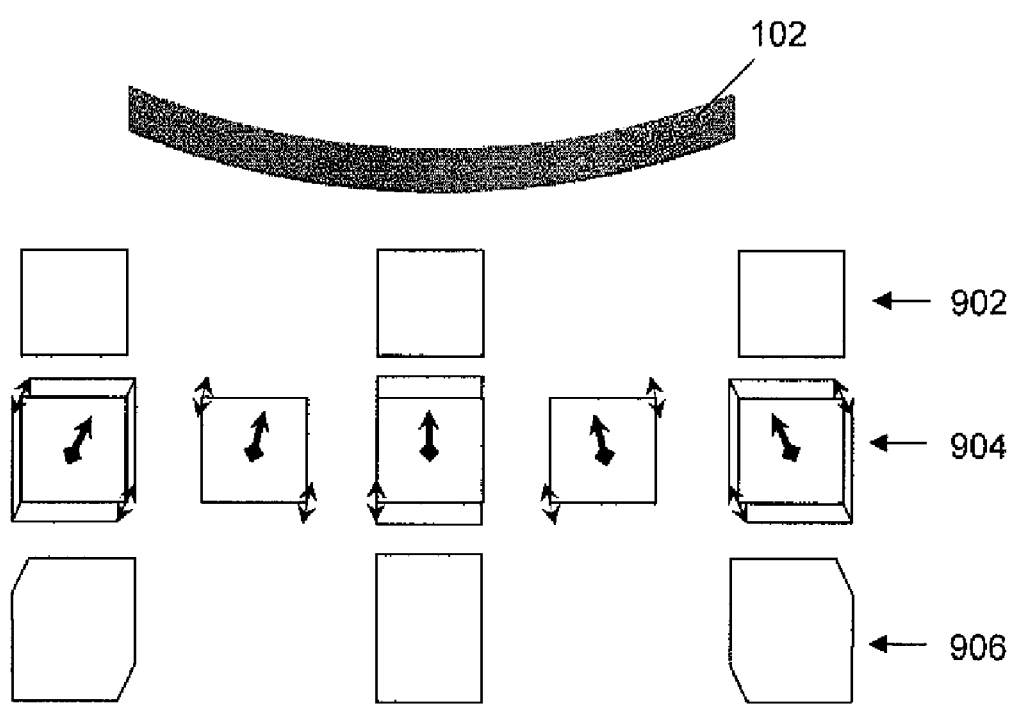
FIG. 9 shows bias correction using shading vector compensation according to a method for compensating shadowing effects according to particular embodiments of the present invention.

An example for such a correction is indicated in FIG. 9 illustrating the compensation using a shading vector for different angles of incidence of the mapped irradiation. Both correction for displacement and for bias is shown. FIG. 9 illustrates the initial design features 902 to be imaged, the corresponding shifted design features 904 with the corresponding correction displacement vectors, indicated by the vectors in the centers, and the correction shading vectors, indicated by the vectors at the edges, and the altered design features 906. The orientation of the shading vector used is related to the azimuth angle.

Figure 10:
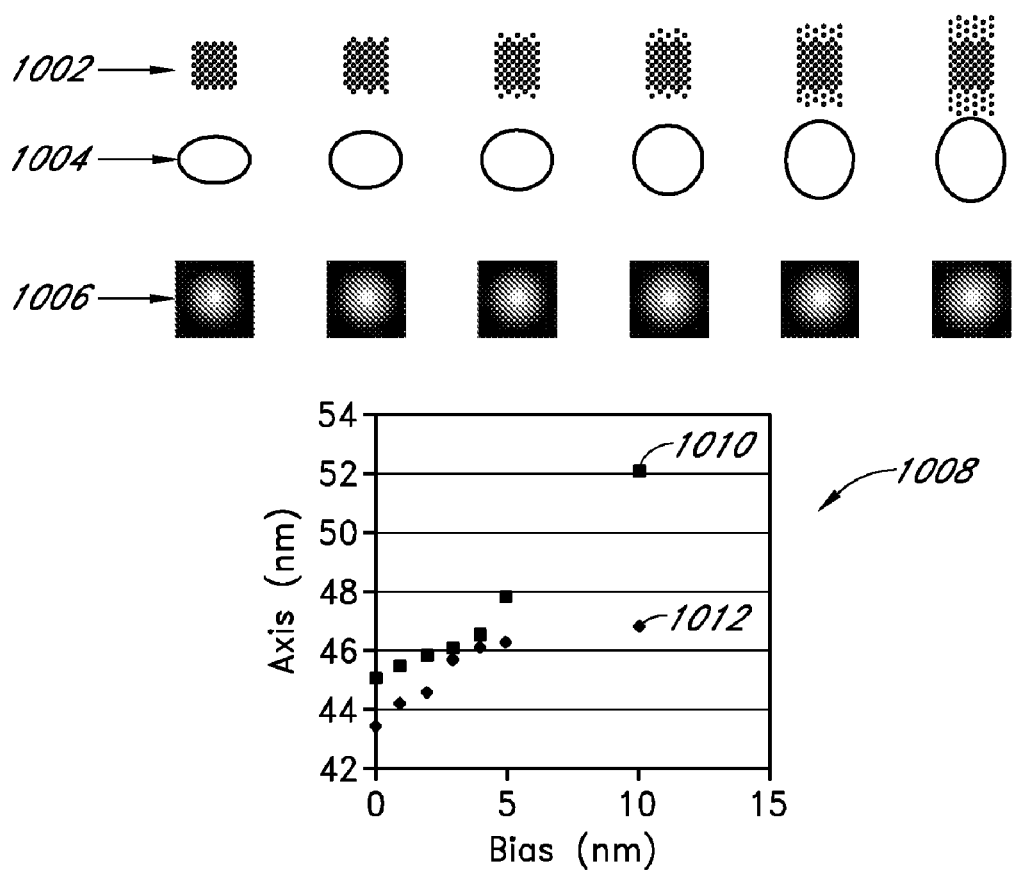
FIG. 10 shows the use of a shading vector correction of ellipticity in the centre of the slit, as used in a method for compensating shadowing effects according to particular embodiments of the present invention.
Figure 10:
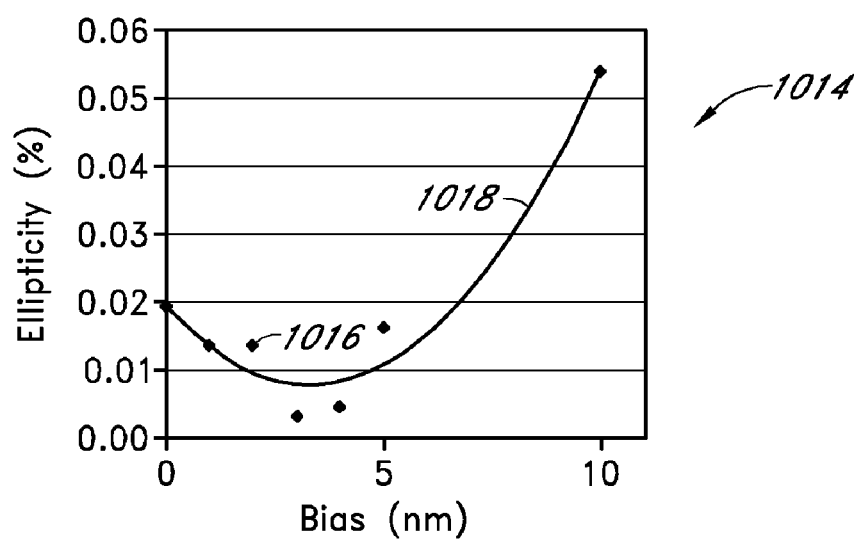
Figure 11:
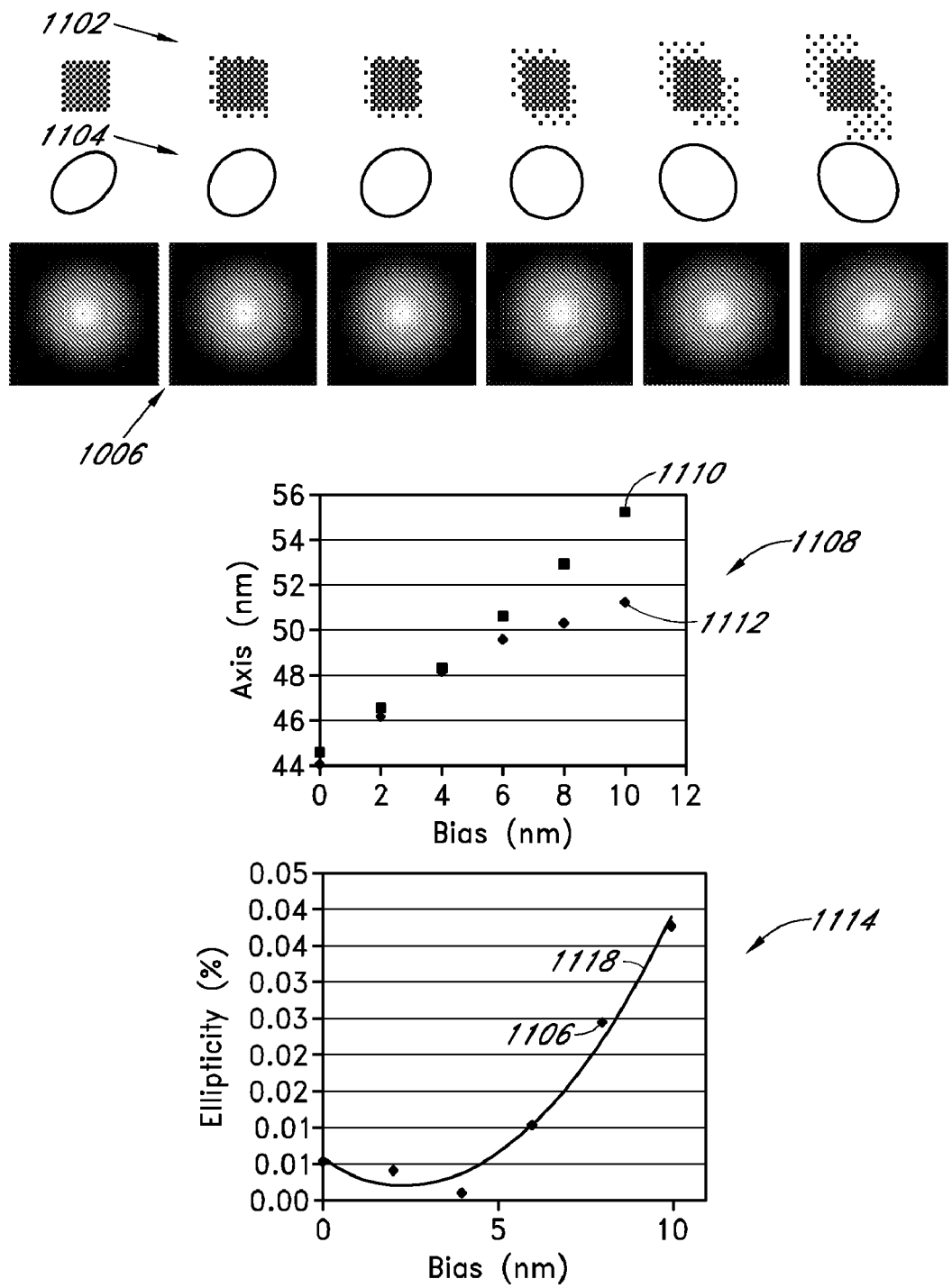
FIG. 11 shows the use of a shading vector correction of ellipticity at the edge of the slit, as used in a method for compensating shadowing effects according to particular embodiments of the present invention.

By way of illustration, the present invention not being limited thereby, the determination of the amplitude of the shift/shifts required is illustrated for an exemplary design of contact holes. FIG. 10 respectively FIG. 11 illustrates the initial design and corresponding shifts 1002, 1102 for contact holes, the ellipticity 1004, 1104 of the resulting imaged contact holes and a resulting image of the contact holes 1006, 1106 for a centre of slit position, i.e. an angle of incidence of the projected irradiation on the design feature of substantially 0° respectively substantially different from 0°. FIG. 10 and FIG. 11 furthermore indicate a graph 1008, 1108 of the shift in axis as function of the bias. The results for the major ellipse axis are shown by squares 1010, 1110, whereas the results for the minor ellipse axis are shown by diamonds 1012, 1112, FIG. 10 and FIG. 11 also illustrate a graph 1014, 1114 of the ellipticity as function of the bias for different values of the bias, indicated by diamonds 1016, 1116. From a fit 1018, 1118 to the ellipticity values it can be seen that the latter corresponds with the bias wherein the shift in axis is similar. In order to determine the amplitude of the shading vector at a certain slit position, i.e. a certain position on the design with respect to the irradiation configuration that will be used, in the present example the major and minor axes of the ellipse are monitored during increase of the shading bias. The corresponding altered basic surfaces for deriving the altered design features are illustrated, as well as the ellipticity and graphs indicating the ellipticity and the length of the major and minor axis as function of the applied bias correction shift. The ellipticity goes through a minimum, where the two axes are virtually identical and the artifacts of shading are fully corrected, thus resulting in a circular contact hole. It can be seen that indeed in this way correction of the change in shape can be obtained. The latter illustrates the possibility to use altered design features as described above for correcting for the shading effects. The latter furthermore illustrates that the shading approach increases the areas of the features in the design. In other words, although an overall orientation-independent bias is obtained using the shading approach, the correction may induce a constant bias. The latter can be corrected by normalizing the biased area to the design value, as also described as optional process in the method according to the first embodiment.

Figure 13A:
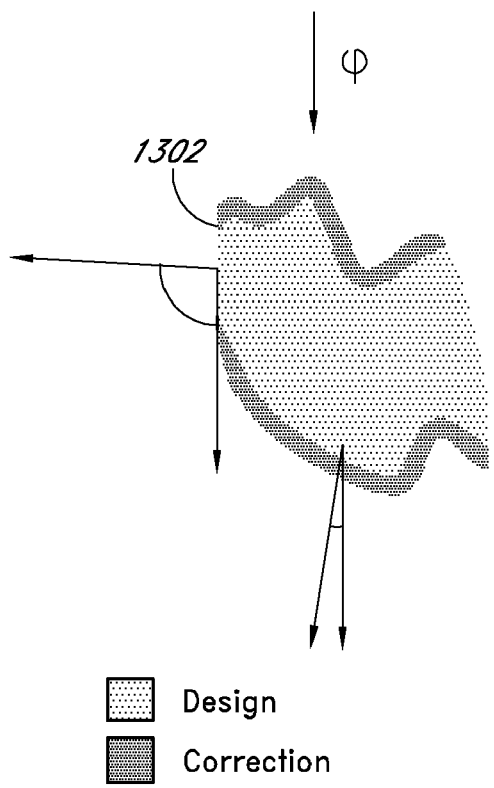
FIG. 13a and FIG. 13b illustrate a rigorous bias correction for shadowing applied to the perimeter of an object (FIG. 13a) and a graph of the obtained critical dimension as function of the orientation of the feature at the perimeter with respect to the incident mapped irradiation as can be used in a method or system according to particular embodiments of the present invention.
Figure 13B:
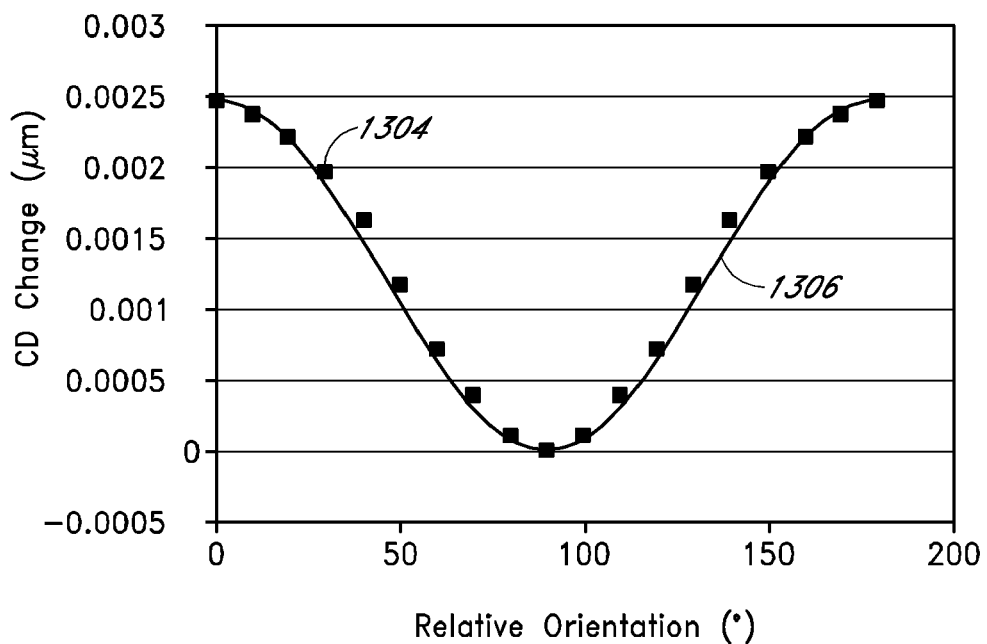

In a fourth embodiment, the present invention relates to any of the methods as described above, wherein the shifting, e.g. for both displacement correction and/or bias correction such as e.g. can be expressed using a shading and/or shifting vector, is generalized to a rigorous approach. In this embodiment, the correction of a feature of arbitrary shape is achieved by biasing and/or shifting each location of its perimeter. This is done by defining a local orientation as the geometrical tangent to the feature edge and by applying a local bias. It is to be noticed that applying one or more correction shifting techniques to each of a large number of the perimeter of an object will result in a more time consuming approach. A trade off between optimization of the correction for shadowing for each point and an efficient time management may be made in this case. An example of a correction according to the present embodiment is indicated in FIG. 13*a* for an object having an edge or perimeter 1302. It can be seen that applying such a correction results in a very small change in CD throughout all relative orientations, as can be seen in the graph in FIG. 13*b*, illustrating the obtained CD change as function of the relative orientation of the incident mapped irradiation with respect to an imaged point of the perimeter. In FIG. 13*b* the resulting critical dimension change as function of relative orientation is shown for different relative orientations, indicated by diamonds 1304. A corresponding fit is shown by the black line 1306.

Figure 12:
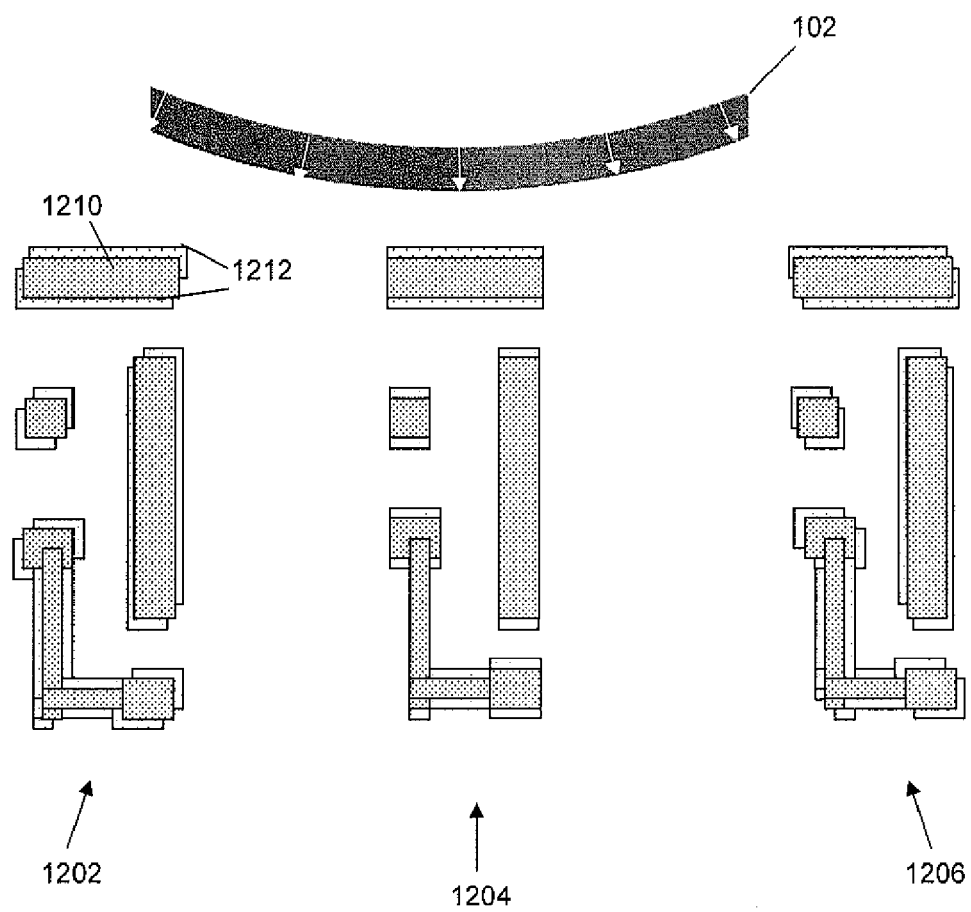
FIG. 12 illustrates the application of the universal shading vector approach to features of arbitrary shapes and orientation, as can be used in a method or system according to particular embodiments of the present invention.

It is an advantage of particular embodiments according to the present aspect that specification of the orientation of the features itself the edges or the shape is not required, as illustrated in FIG. 12. The latter is advantageous as it results in less complex correction processes, i.e. it ensures that the compensation procedure is fast enough for full chip mitigation as basically only one imaging processing process is required. FIG. 12 illustrates application of shadowing correction for different design features 1202, 1204, 1206 on different positions on the design, i.e. different angles of incidence of the mapped irradiation or different positions with respect to the irradiation slit. The initial design features 1210 and the shifted design features 1212, used for constructing the altered design features for correcting shadowing effects, are indicated.

In one embodiment, the shading and shifting vector approach is simplified by taking an identical amplitude of the shading vector and the shifting vector and selecting as their orientations simply the azimuth angle, i.e. the angle of incidence of the mapped projected irradiation on the design feature at the design level. In this case the approach will need a single vector defined as universal shading vector.

One embodiment encompasses correction of the centre of gravity as well as correction to all points of the perimeter and using these points as new perimeter, correction to certain points of the perimeter or points approximated thereby, such as e.g. applying correction to the vertex of polygons or approximated polygons of the design features or to centers of sides of such polygons or approximated polygons.

In a second aspect, the present invention relates to a method of manufacturing a lithographic processing mask and to a lithographic processing mask thus obtained. The method comprises a process of obtaining a mask design and processing a mask according to the obtained mask design. Obtaining a mask design thereby comprises obtaining a mask design obtained using a method for designing as described in the first aspect or performing the processes according to the method for designing as described in the first aspect. Once this design is obtained, the method is proceeded by processing a mask according to the design. Such processing may be performed in any suitable way, it is applying conventional mask processing techniques as known in the art. Such techniques may e.g. be obtaining a substrate, providing a reflective layer on the substrate and providing absorbing mask features on the reflective layer using conventional semiconductor processing processes. The obtained lithographic processing mask may be a deep ultra-violet or extreme ultraviolet lithographic processing mask. It may be adapted for use in reflective lithographic processing.

In a third aspect, the present invention also relates to a method for setting up lithographic processing. The method for lithographic processing comprises irradiating mask features of a lithographic mask using a predetermined irradiation configuration. The method for setting up such a lithographic process is adapted for selecting a lithographic mask with a mask design as described in the first aspect or obtained using a method for designing as described in the first aspect or performing the processes according to the method for designing as described in the first aspect.

In a fourth aspect, the present invention relates to a method for lithographic processing of a substrate and to a device thus obtained. The method thereby comprises irradiating mask features of a lithographic mask using a predetermined design. The method for lithographic processing thereby is characterized by selecting a design for the lithographic mask according to a design as described in the first aspect or as obtained using a method for designing according to the first aspect. Other conventional processes for lithographic processing of a substrate may be incorporated as known in the art.

Figure 15:
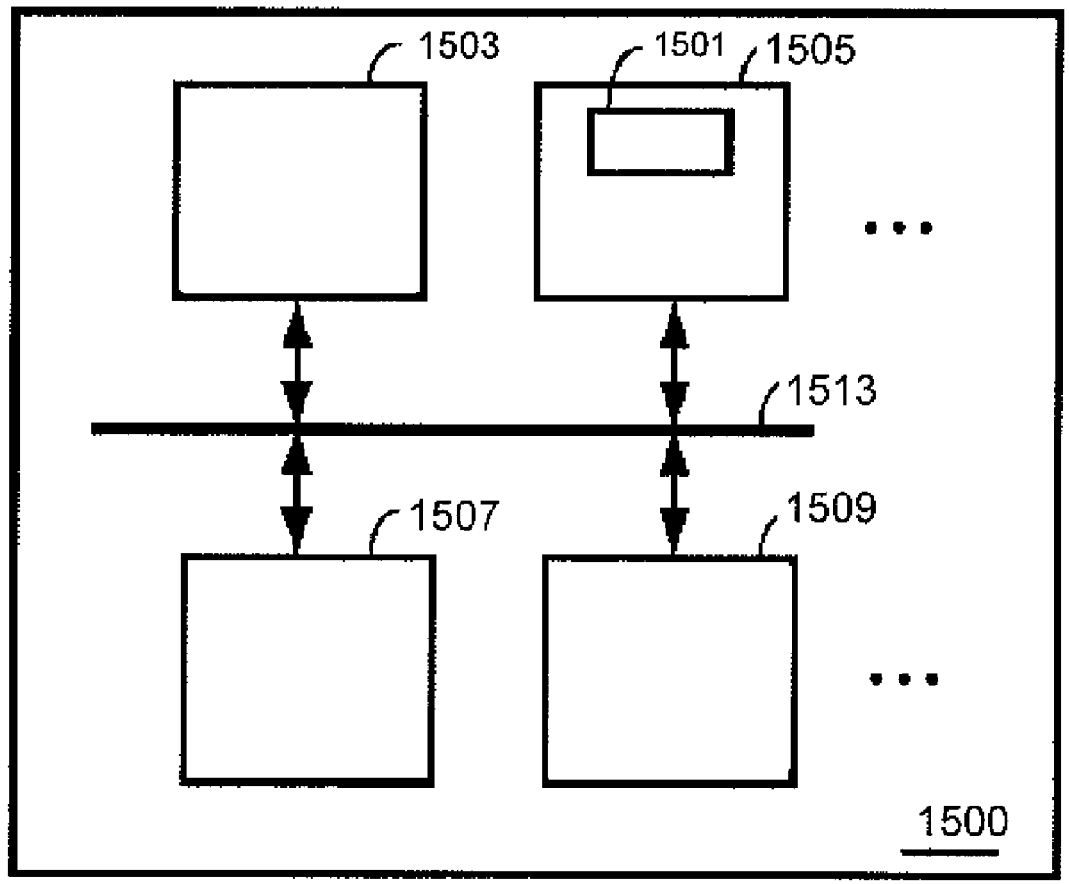
FIG. 15 illustrates a processing system as used in a system for designing a lithographic mask according to embodiments of an aspect of the present invention.

In a fifth embodiment, the present invention relates to a processing system wherein the method embodiments according to the present invention are implemented. The processing system comprises an input module configured to obtain an initial design for the lithographic mask comprising a plurality of initial design features having an initial position, a processing module configured to apply at least one shift to at least one initial design feature, and a calculating module configured to derive there from an altered design so as to compensate for shadowing effects when irradiating the substrate using a lithographic mask corresponding to the altered design in the predetermined irradiation configuration. An exemplary processing system 1500 is shown in FIG. 15. FIG. 15 shows one configuration of processing system 1500 that includes at least one programmable processor 1503 coupled to a memory subsystem 1505 that includes at least one form of memory, e.g., RAM, ROM, and so forth. A storage subsystem 1507 may be included that has at least one disk drive and/or CD-ROM drive and/or DVD drive. In some implementations, a display system, a keyboard, and a pointing device may be included as part of a user interface subsystem 1509 to provide for a user to manually input information. Ports for inputting and outputting data also may be included. More elements such as network connections, interfaces to various devices, and so forth, may be included, but are not illustrated in FIG. 15. The system may e.g. comprise an output module configured to output an altered design. The various elements of the processing system 1500 may be coupled in various ways, including via a bus subsystem 1513 shown in FIG. 15 for simplicity as a single bus, but will be understood to those in the art to include a system of at least one bus. The memory of the memory subsystem 1505 may at some time hold part or all (in either case shown as 1511) of a set of instructions that when executed on the processing system 1500 implementing the method embodiments described herein. Thus, while a processing system 1500 such as shown in FIG. 15 is prior art, a system that includes the instructions to implement aspects of the present invention is not prior art, and therefore FIG. 15 is not labeled as prior art.

It is to be noted that the processor 1503 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g., by operating on input data and generating output data. Accordingly, one embodiment includes a computer program product which provides the functionality of any of the methods described herein when executed on a computing device. Further, one embodiment includes a data carrier such as for example a DVD, CD-ROM or a diskette which stores the computer product in a machine-readable form and which executes at least one of the methods as described above when executed on a computing device. Nowadays, such software is often offered on the Internet or a company Intranet for download, hence one embodiment includes transmitting the computer product described above over a local or wide area network.

Embodiments of the present invention encompasses correction of the centre of gravity as well as correction to all points of the perimeter and using these points as new perimeter, correction to certain points of the perimeter, a plurality of points of the perimeter or points approximated thereby, such as e.g. applying correction to the vertex of polygons or approximated polygons of the design features or to centers of sides of such polygons or approximated polygons. Such a correction may be a correction using a shading vector and/or a correction using a shifting vector. It thus may be a correction to compensate for biasing and/or a correction to compensate for overlay.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of designing a lithographic mask for use in lithographic processing of a substrate, the lithographic processing comprising irradiating mask features of the lithographic mask using a predetermined irradiation configuration, the method of designing the lithographic mask comprising:
   obtaining an initial design for the lithographic mask comprising a plurality of initial design features having an initial position; and
   applying, by a computer, at least one shift to at least one initial design feature and deriving therefrom an altered design so as to compensate for shadowing effects when irradiating the substrate using the lithographic mask corresponding to the altered design in the predetermined irradiation configuration,
   wherein the at least one shift of the at least one initial design feature is independent of an orientation of the at least one initial design feature.

2. The method according to claim 1, wherein applying at least one shift to at least one initial design feature comprises applying at least a shading vector to at least one initial design feature and/or applying at least a shifting vector to at least one initial design feature.

3. The method according to claim 2, wherein applying at least a shading vector to at least one initial design feature and deriving therefrom an altered design so as to compensate for shadowing effects comprises deriving the altered design for compensating a bias effect or an overlay effect on the initial design features.

4. The method according to claim 1, wherein the at least one shift to the at least one initial design feature comprises a shift of at least two initial design features, each shift being along a shifting axis, the shifting axes being intersecting.

5. The method according to claim 4, wherein the shifting axes are intersecting substantially on a design axis dividing the design in two parts of substantially equal size.

6. The method according to claim 5, wherein the direction of the shifting axis for design features positioned symmetrically with respect to the design axis is mirrored with respect to the design axis.

7. The method according to claim 4, wherein an amplitude of the at least one shift is adapted as function of the direction of incidence of mapped irradiation on the initial design features.

8. The method according to claim 1, the predetermined irradiation configuration comprising a predetermined position between the mask features and an irradiation source, the method comprising:
   obtaining a mapping (M) of the predetermined irradiation configuration based on a perpendicular projection (P) of the irradiation source on a plane determined by the mask features and a mapping of the projected irradiation source and the mask features to the initial design; and
   determining directions of incidence of mapped irradiation on the initial design features,
   wherein applying at least one shift to the at least one initial design feature comprises applying a shift of the at least one initial design feature along the directions of incidence of mapped irradiation on the initial design features.

9. The method according to claim 8, wherein the direction of incidence of mapped irradiation is determined by a position of the mapped projected irradiation source and the position of the initial design feature.

10. The method according to claim 8, wherein mapping the projected irradiation source and the mask features to the initial design comprises mapping the mask features to the initial design features and providing a mapped projected irradiation source having a relative position with respect to the initial design features substantially equal to the relative position of the projected irradiation source with respect to the mask features.

11. The method according to claim 8, wherein applying the at least one shift to the at least one initial design feature comprises applying a shift of the at least one initial design feature along the directions of incidence of mapped irradiation on a reference point of the initial design features.

12. The method according to claim 1, wherein the lithographic mask is a reflective lithographic mask and the predetermined irradiation configuration comprises an off-axis irradiation source.

13. The method according to claim 1, wherein the predetermined irradiation configuration comprises a ring-shaped irradiation source.

14. The method according to claim 1, wherein the design comprises a plurality of sections and wherein the initial design features positioned in each section are shifted in the same direction.

15. The method according to claim 14, wherein two features positioned in sections positioned symmetric with respect to an axis of symmetry of a projected irradiation field of the irradiation source are shifted in the same direction and with the same amplitude.

16. The method according to claim 1, wherein deriving the altered design comprises providing at least one altered design feature in the altered design, the at least one altered design feature having a surface area covering at least a sum of an area covered by the surface area of the initial design feature positioned at least two different positions.

17. The method according to claim 16, wherein the at least one altered design feature has a surface area covering at least the area determined by a polygon determined by outer corners of the initial design feature positioned at least two different positions.

18. The method according to claim 1, wherein an amplitude of the at least one shift depends on the position of the design feature in the design.

19. The method according to claim 1, wherein deriving the altered design comprises applying a local bias correction or a local overlay correction to a plurality of points along a perimeter of the feature.

20. The method according to claim 1, wherein deriving therefrom the altered design so as to compensate for shadowing effects comprises deriving an altered design for compensating a shift of the initial design features.

21. The method according to claim 1, wherein a correction of the size of the altered design features is performed for adjusting a size of the altered design features to a target size for imaged features.

22. A method of setting up a lithographic process, the lithographic process comprising irradiating mask features of a lithographic mask using a predetermined irradiation configuration, the method comprising selecting a lithographic mask having a design obtained using a method according to claim 1.

23. A method of lithographically processing a substrate, the method comprising irradiating mask features of a lithographic mask using a predetermined irradiation configuration, the lithographic mask having a design obtained using a method according to claim 1.

24. A non-transitory computer readable medium having stored therein a program adapted for executing a method according to claim 1.

25. A system adapted for designing a lithographic mask for use in lithographic processing of a substrate, the lithographic processing comprising irradiating mask features of a lithographic mask using a predetermined irradiation configuration, the system comprising:
    an input module configured to obtain an initial design for the lithographic mask comprising a plurality of initial design features having an initial position;
    a processing module configured to apply at least one shift to at least one initial design feature; and
    a calculating module configured to derive therefrom an altered design so as to compensate for shadowing effects when irradiating the substrate using a lithographic mask corresponding to the altered design in the predetermined irradiation configuration,
wherein the at least one shift of the at least one initial design feature is independent of an orientation of the at least one initial design feature.

* * * * *